United States Patent
Hoegberg

(10) Patent No.: US 10,613,143 B2
(45) Date of Patent: Apr. 7, 2020

(54) SYSTEM AND METHOD FOR PROVIDING AUTOMATION OF MICROPROCESSOR ANALOG INPUT STIMULATION

(71) Applicant: Hamilton Sundstrand Corporation, Charlotte, NC (US)

(72) Inventor: Lon R. Hoegberg, Belvidere, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 74 days.

(21) Appl. No.: 15/943,871

(22) Filed: Apr. 3, 2018

(65) Prior Publication Data
US 2019/0302182 A1 Oct. 3, 2019

(51) Int. Cl.
| G01R 31/00 | (2006.01) |
| G01R 31/317 | (2006.01) |
| G05B 23/02 | (2006.01) |
| G05B 19/042 | (2006.01) |

(52) U.S. Cl.
CPC . *G01R 31/31723* (2013.01); *G01R 31/31708* (2013.01); *G01R 31/31712* (2013.01); *G05B 19/0428* (2013.01); *G05B 23/02* (2013.01); *G05B 23/0256* (2013.01)

(58) Field of Classification Search
None
See application file for complete search history.

(56) References Cited

U.S. PATENT DOCUMENTS

| 4,044,244 A | 8/1977 | Foreman et al. |
| 4,155,116 A | 5/1979 | Tawfik et al. |
| 4,669,083 A * | 5/1987 | Laviron ............... G06F 17/5022 703/15 |
| 5,638,383 A | 6/1997 | Wotzak et al. |
| 5,640,509 A | 6/1997 | Balmer et al. |
| 5,946,472 A * | 8/1999 | Graves .................. G06F 11/261 703/16 |
| 6,486,809 B1 | 11/2002 | Figoli |
| 6,559,783 B1 | 5/2003 | Stoneking |
| 8,589,139 B2 * | 11/2013 | Mohr .................... G01R 31/007 703/14 |
| 2015/0227117 A1 * | 8/2015 | Hampton ........... G05B 23/0256 700/79 |

FOREIGN PATENT DOCUMENTS

WO 2015116469 8/2015

OTHER PUBLICATIONS

L. Y. Ungar and M. D. Sudolsky, "Tapping into boundary scan resources for vehicle health management," 2016 IEEE AUTOTESTCON, Anaheim, CA, 2016, pp. 1-10.doi: 10.1109/AUTEST.2016.7589618 (Year: 2016).*
The Extended European Search Report for EP Application No. 19167068.6, dated Aug. 5, 2019.

* cited by examiner

*Primary Examiner* — Daniel F. McMahon
(74) *Attorney, Agent, or Firm* — Carlson, Gaskey & Olds, P.C.

(57) ABSTRACT

A controller system includes a microprocessor having a sequencer configured to output at least one spare multiplexor control signal, a memory, and a plurality of sensor inputs. At least one stimulation circuit is connected to a sensor signal line. The at least one stimulation circuit being connected to the at least one spare multiplexor control signal. The stimulation circuit is configured such that a state of the at least one spare multiplexor control signal controls a state of the stimulation circuit.

18 Claims, 3 Drawing Sheets

SYSTEM AND METHOD FOR PROVIDING AUTOMATION OF MICROPROCESSOR ANALOG INPUT STIMULATION

TECHNICAL FIELD

The present disclosure relates generally to microprocessor testing systems, and more specifically to a microprocessor including an automatic analog input stimulation for testing purposes.

BACKGROUND

Controller systems, such as those including microprocessors, frequently require analog inputs in order to perform the necessary control functions. By way of example, a microprocessor may be configured to receive multiple signals from analog sensors, with the resultant controls being at least partially based on the received signals. However, as is generally known in the art, microprocessors operate using digital data. In order to accommodate the analog signals, analog to digital converters are commonly used.

Further, in some systems various functionalities of the microprocessor are tested by providing a known analog input to a given input pin. This is commonly achieved through the usage of a stimulation circuit connected to an analog input and configured to cause the analog input to have a specific, predefined, value when the stimulation circuit is activated. However, in existing controllers operation and control of a stimulation circuit requires substantial software overhead by the microprocessor, and can limit the ability of the microprocessor to perform other tasks related to the controls.

SUMMARY OF THE INVENTION

In one exemplary embodiment a controller system includes a microprocessor including a sequencer configured to output at least one spare multiplexor control signal, a memory, and plurality of sensor inputs, at least one stimulation circuit connected to a sensor signal line, the at least one stimulation circuit being connected to the at least one spare multiplexor control signal, and wherein the stimulation circuit is configured such that a state of the at least one spare multiplexor control signal controls a state of the stimulation circuit.

In another example of the above described controller system the microprocessor further includes at least one analog to digital converter, and each of the sensor inputs in the plurality of sensor inputs is received at the analog to digital converter.

Another example of any of the above described controller systems further includes a multiplexor having a plurality of multiplexor sensor inputs and a multiplexed output, wherein the multiplexed output is received at one of the plurality of sensor inputs, and the sequencer is further configured to output at least one multiplexor control signal to the multiplexor.

In another example of any of the above described controller systems where at least one stimulation circuit includes a first stimulation circuit connected to a sensor line connected to one of the multiplexor sensor inputs in the plurality of multiplexor sensor inputs.

In another example of any of the above described controller systems where at least one stimulation circuit further includes a second stimulation circuit connected to a second sensor line, and the second sensor line is connected to one of the sensor inputs in the plurality of sensor inputs.

In another example of any of the above described controller systems where at least one stimulation circuit is configured to operate as a passthrough circuit when the at least one spare multiplexor control signal is in a first state.

In another example of any of the above described controller systems where at least one stimulation circuit is configured to drive the sensor signal to a first value when the at least one spare multiplexor control signal is in a second state, the second state being distinct from the first state.

In another example of any of the above described controller systems where at least one spare multiplexor control signal includes a plurality of spare multiplexor control signals and the number of states in which the stimulation circuit is dependent on the quantity of spare multiplexor signals in the at least one spare multiplexor signal.

In another example of any of the above described controller systems where at least one stimulation circuit comprises a plurality of stimulation circuits, each of the stimulation circuits being connected to a corresponding sensor signal line.

In another example of any of the above described controller systems each of the stimulation circuits in the plurality of stimulation circuits is controlled via the same spare multiplexor signal in the at least one spare multiplexor control signal.

In another example of any of the above described controller systems each of the stimulation circuits in the plurality of stimulation circuits is controlled via a distinct spare multiplexor signal in the at least one spare multiplexor control signal.

In another example of any of the above described controller systems each sensor signal line is connected to an aircraft sensor.

An exemplary method for testing a microprocessor includes stimulating at least one sensor input via a stimulation circuit, wherein the stimulation circuit is controlled by at least one spare multiplexor signal output from a microprocessor sequencer, analyzing a response of the stimulated sensor input, and determining that at least one of a multiplexor and a conditioning circuit are healthy in response to the stimulated sensor input matching an expected stimulated sensor input.

In another example of the above described exemplary method for testing a microprocessor stimulating at least one sensor input comprises stimulating the sensor input for a duration of time at least as long as a circuit settling time.

In another example of any of the above described exemplary methods for testing a microprocessor stimulating the at least one sensor input comprises providing a plurality of spare multiplexor signal outputs from the microprocessor sequencer to the stimulation circuit.

In another example of any of the above described exemplary methods for testing a microprocessor stimulating the at least one sensor input comprises driving the sensor input to one of a plurality of predefined values, wherein the value is determined based on a high and low state of each of the spare multiplexor signals in the plurality of multiplexor signals.

In another example of any of the above described exemplary methods for testing a microprocessor stimulating at least one sensor input via a stimulation circuit comprises engaging a first stimulation circuit via a first spare multiplexor signal output, and engaging a second stimulation circuit via a second spare multiplexor output signal.

Another example of any of the above described exemplary methods for testing a microprocessor further includes operating the stimulation circuit as a pass through circuit when no control signal is output by the sequencer on the at least one spare multiplexor signal output.

In one exemplary embodiment an aircraft control system includes a general aircraft controller, a plurality of dedicated systems controllers, each of the dedicated systems controllers including a microprocessor connected to a sensor network, each of the microprocessors includes a sequencer configured to output at least one spare multiplexor control signal, a memory, and plurality of sensor inputs, at least one stimulation circuit connected to a sensor signal line, the at least one stimulation circuit being connected to the at least one spare multiplexor control signal, and wherein the stimulation circuit is configured such that a state of the at least one spare multiplexor control signal controls a state of the stimulation circuit.

These and other features of the present invention can be best understood from the following specification and drawings, the following of which is a brief description.

DETAILED DESCRIPTION OF AN EMBODIMENT

Figure 1:
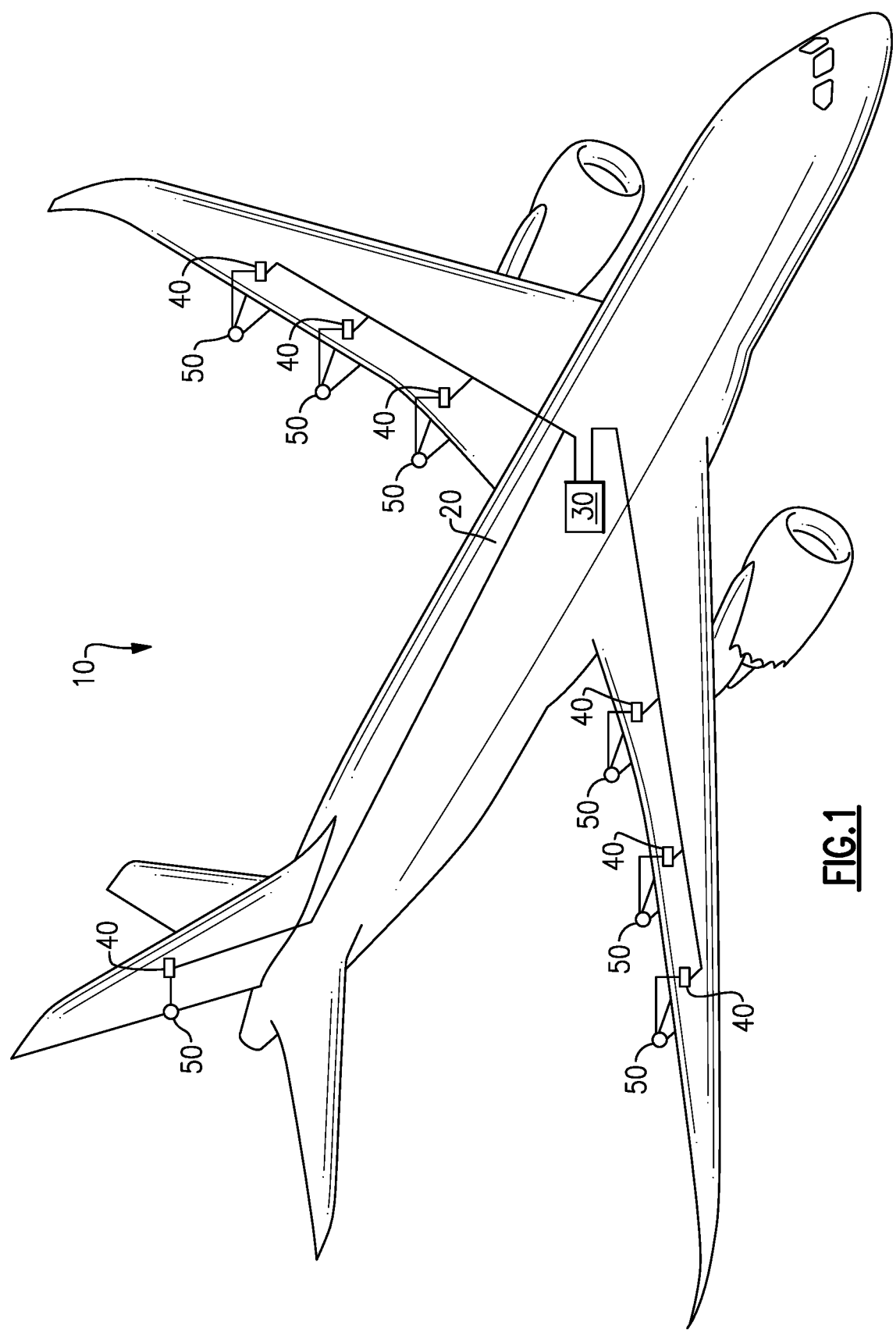
FIG. 1 schematically illustrates an exemplary aircraft including multiple controllers distributed throughout the aircraft.

FIG. 1 schematically illustrates an exemplary aircraft 10 including an electrical system 20 having a general aircraft controller 30. The general aircraft controller 30 is connected to multiple dedicated system controllers 40, each of which includes one or more microprocessors. The dedicated system controllers 40 are each connected to a corresponding sensor network 50 that includes one or more analog sensors configured to detect a characteristic of the system controlled by the corresponding dedicated system controller 40. It should be appreciated that the particular illustrated dedicated system controllers 40 are purely exemplary in nature, and a practical implementation could include any number of additional dedicated system controllers 40 and sensor networks 50, or less dedicated system controllers 40 and sensor networks 50, and still incorporate the testing system and method disclosed herein.

In order to accommodate the multiple analog inputs from the sensor network 50, a multiplexor is included that combines multiple analog inputs into a single input for the microprocessor. In general, each analog input at the microprocessor includes a sense circuit prior to the analog to digital conversion, and is conditioned to a proper voltage and noise filtering in order to be properly read by the microprocessor. The microprocessor within the dedicated system controller 40 includes a sequencer that outputs multiplexor control signals to the multiplexor and allows for the signals from the sensor network 50 to be multiplexed via the multiplexor. The multiplexing and conditioning allows the microprocessor to properly interpret the multiple signals, and to properly convert the multiple signals into a digital signal for storage and processing.

One method used to ensure that the microprocessors within any given dedicated system controller 40 are operating correctly is to provide the microprocessor with a known preprogrammed value at a given sensor signal input and verify that the circuit is stimulated with the proper value. The method directs the sensor results to two different memory locations within the microcontroller, a first memory location with the stimulation circuit on and a second memory location with the stimulation circuit off. The microprocessor can then compare the value at the first memory location with an expected value of the stimulated input and determine whether the input conditioning and multiplexing is operating properly. In order to reduce the software overhead required to operate the stimulation circuits, the stimulation circuits can be controlled via multiplexor control signals output from a sequencer within the corresponding microprocessor.

Figure 2:
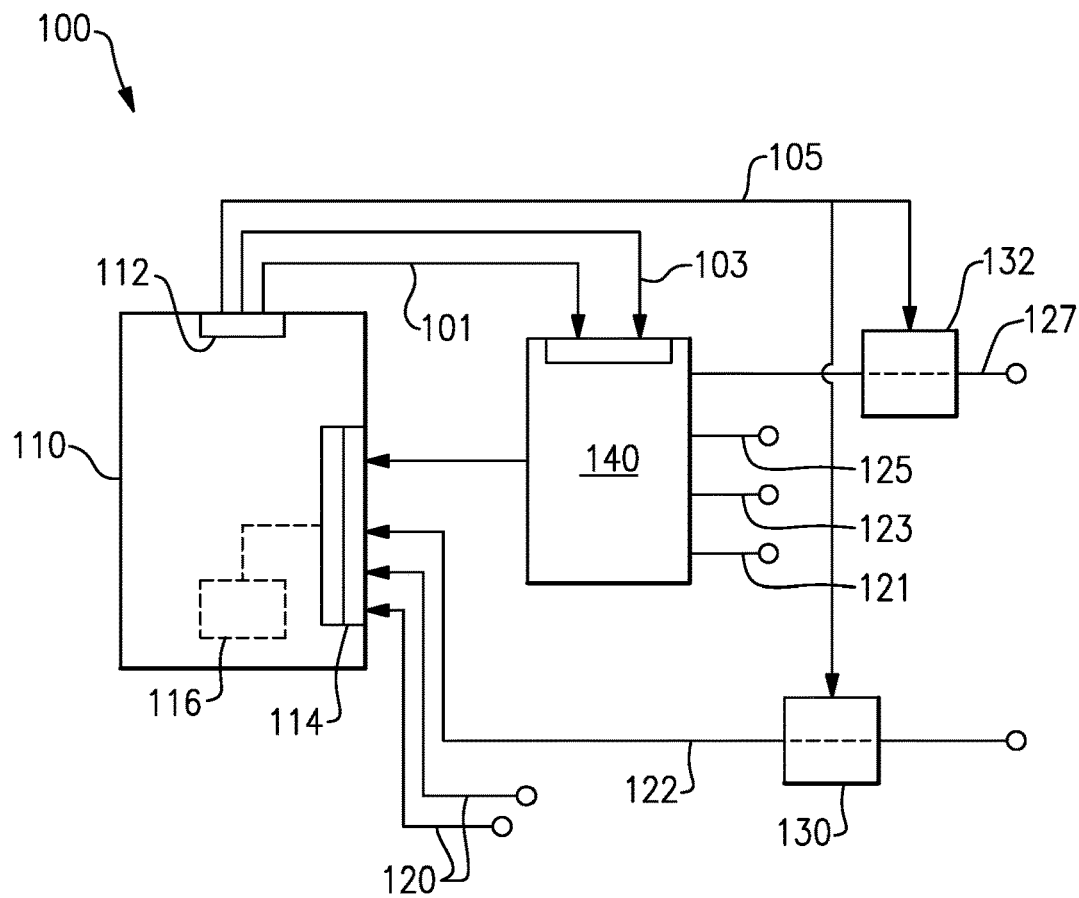
FIG. 2 schematically illustrates a controller configuration according to one example.

With continued reference to FIG. 1, FIG. 2 Schematically illustrates an exemplary control configuration for a controller system 100. Included within the controller system 100 is a microprocessor 110. The microprocessor 110 includes a sequencer 112 configured to output three multiplexor control signals 101, 103, 105. In alternative examples, any number of multiplexor control signals 101, 103, 105 can be output by the sequencer 112 provided that the number of multiplexor control signals 101, 103, 105 is at least one greater than the total number of multiplexor signals 101, 103, 105 required to control any multiplexing of input signals. An analog to digital converter 114 is disposed at the signal inputs of the microprocessor 110 and converts any input signals into a digital form. The analog to digital converter 114 in the exemplary embodiment is a component of the microprocessor 110. In alternative embodiments, the analog to digital converter 114 can be a distinct component from the microprocessor 110. The converted signals are then stored in a memory 116, with the particular memory address of each signal being determined by the input pin on which the signal was received and the specific state of the multiplexor output signals 101, 103, 105.

Connected to two of the input pins are direct analog sensor signals 120. Connected to a third input pin is a third direct analog sensor signal 122. The third direct analog sensor signal 122 is passed through a stimulation circuit 130. The stimulation circuit 130 receives a multiplexor control signal 105 and, when not commanded to be active, the stimulation circuit 130 operates as a pass through with no impact on the received sensor signal 122.

Connected to a fourth input pin is an output of a multiplexor 140. The exemplary multiplexor 140 is connected to two multiplexor control signals 101, 103 output from the sequencer 112. The two multiplexor control signals 101, 103 allow the multiplexor 140 to properly multiplex four distinct analog sensor signals 121, 123, 125, 127. A second stimulation circuit 132 is disposed at one of the signals 127 being multiplexed by the multiplexor 140, and is also connected to the multiplexor control signal 105 output from the sequencer 112. In alternative examples, additional multiplexor control signals can be output from the sequencer 112 to the multiplexor 140, thereby allowing additional signals to be multiplexed by the multiplexor 140 according to known multiplexing techniques.

By utilizing a spare multiplexor control signal 105 (i.e. a multiplexor control signal 105 that is not required to control the multiplexor 140), the sequencer 112 can control the operation of the stimulation circuits 130, 132. Further, in example embodiments including additional spare multiplexor control signals, one or more of the stimulation circuits 130, 132 can receive multiple inputs allowing for the analog input on the corresponding input line to be controlled to multiple distinct stimulated states. By way of example, a stimulation circuit 130 receiving two multiplexor control signals can be operated in four different states as defined by the high/low state of the control signals (00, 01, 10 and 11). Each state results in a different operating point. For example, the setting 00 may be normal with no stimulation, 01 a stimulation to the minimum condition, 10 a stimulation to a median condition, and 11 a stimulation to a maximum condition. As can be appreciated, the greater the number of spare multiplexor signals available, the greater the number of states that a connected stimulation circuit 130, 132 can be driven to. As can be appreciated the number of stimulation states can be expanded by expanding the number of multiplexor control signals utilized to control the stimulation circuit.

By utilizing spare multiplexor outputs 105 from the sequencer 112 to control the stimulation circuits 130, 132, the amount of software overhead required to operate the stimulation circuits 130, 132 and test the microprocessor 110 is reduced. The reduced software overhead occurs because the sequencer progresses through all of the necessary multiplexor settings while automatically controlling the analog to digital converter and placing the resulting values into the processors RAM. This allows the software to read the most recent value for all conditions (normal and each stimulation setting) at any time without the overhead of controlling the stimulation and analog to digital converter.

Figure 3:
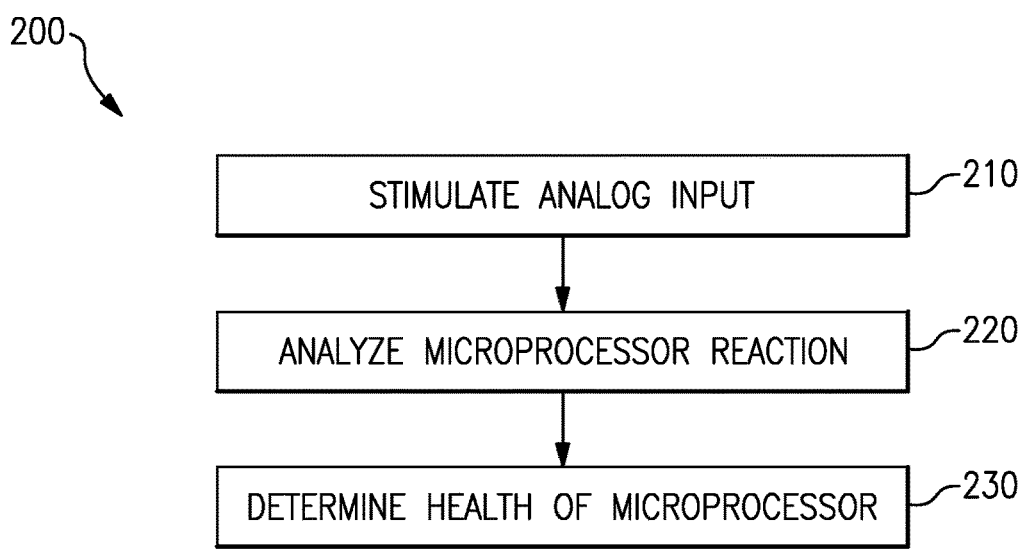
FIG. 3 illustrates a method of operating the control configuration of FIG. 2 in order to provide a test value to at least one controller input.

With continued reference to FIGS. 1 and 2, FIG. 3 illustrates a method for self-testing a microprocessor 110 in the controller system 100 of FIG. 2. Initially, the microprocessor 110 outputs a multiplexor control signal on the spare multiplexor control signal line 105 that is connected to one or more stimulation circuits 130, 132 in a "Stimulate Analog Input" step 210 using the sequencer 112. The multiplexor control signal causes the connected stimulation circuit 130, 132 to stimulate the corresponding analog input, driving the input value to a predetermined stimulation value.

In examples where multiple spare multiplexor control signal lines are connected to any given stimulation circuit, the particular combination of multiplexor control signal values determines the level of stimulation applied to the corresponding analog input line in the manner described above. Once the stimulation is turned on or off, the microprocessor 110 waits a predefined time period, to allow the circuit output to transition to the new value before creating the analog to digital converted value to be used by the microprocessor. This can be referred to as waiting a duration equal to the settling time of the circuit after adjusting the stimulating setting.

In some examples, once the stimulation circuits 130, 32 have been applied for a sufficient duration to ensure the expected reaction from the microprocessor 110, the microprocessor 110, or another controller within the system, analyzes the reactions of the microprocessor 110 in an "Analyze Microprocessor Reactions" step 220. When the microprocessor is healthy (e.g. in full working order), the predefined inputs resulting from the stimulated analog inputs will define a known microprocessor output or reaction. During the analyze microprocessor reactions step 220, the microprocessor 110, or other controller, compares the actual reactions of the microprocessor 110 to the expected reactions. Once the comparison has been made, the microprocessor 110, or other controller, determines the health of the microprocessor 110 in a "Determine Health of Microprocessor" step 230.

With continued reference to FIGS. 1-3, FIG. 4 illustrates a method 300 for generating stimulated input values for each input of the microprocessor 110 of FIG. 2. Initially, the standard operational controls are output from the microprocessor 110 on the utilized multiplexor control lines 101, 103 and the spare multiplexor control line 105 in an "Output Normal Controls" step 310. The resultant sensor signals are processed through the analog to digital converter 114, and stored in a second memory location in an "Store Operational Sensor Values" step 320.

Once the normal operational values have been stored, the microprocessor 110 outputs a stimulation signal on the spare multiplexer control line(s) 105, and the standard multiplexor controls on the utilized multiplexor control lines 101, 103 in a "Stimulate Sensor Input" step 330. Once stimulated, the sensor input is passed through the analog to digital converter, and the multiplexor where appropriate, and stored in the first memory location in a "Store Stimulated Sensor Input" step 340. This process is then re-iterated for all of the sensor inputs at the microprocessor 110 in a "Repeat For All Sensor Inputs" step 350.

Figure 4:
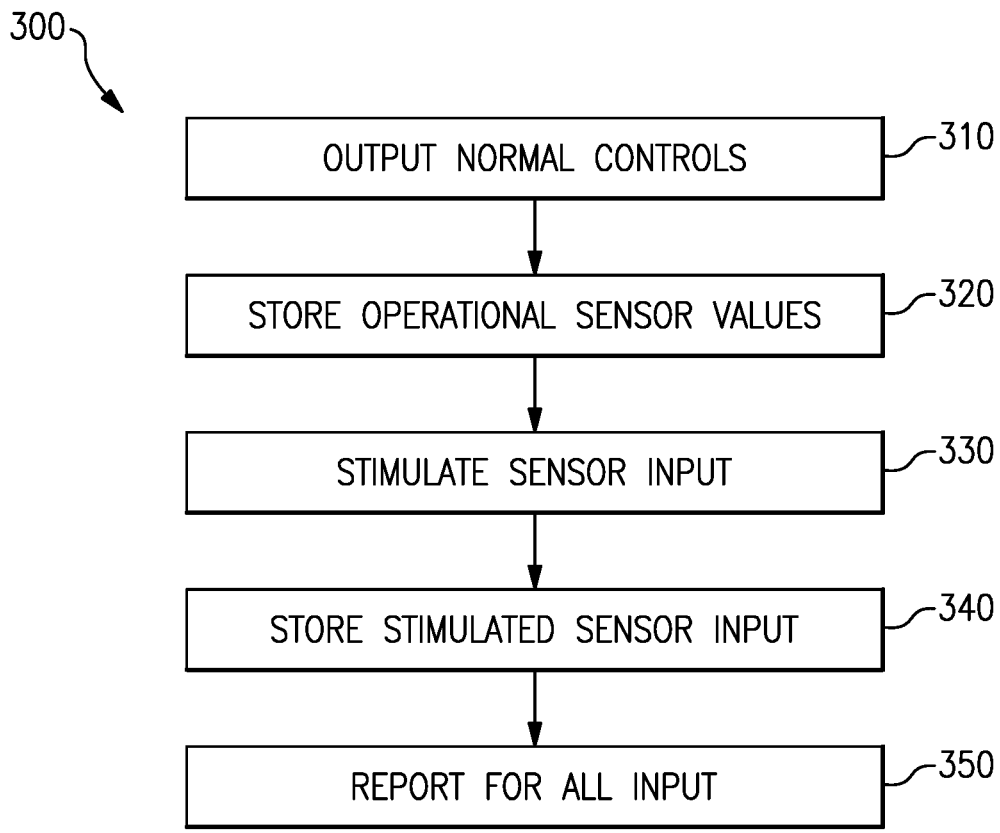
FIG. 4 illustrates a method of generating a stimulated input value for each input to a microprocessor within the controller configuration of FIG. 2.

With continued reference to FIGS. 1-4, FIG. 5 schematically illustrates a method 400 for determining the health of a given input utilizing the stimulated sensor input value determined through the method 300 of FIG. 4. Initially, the microprocessor 110 reads the normal value of the sensor input from the second memory location in a "Read Normal Value" step 410. The normal value is used for microprocessor 110 control operations. Next, the microprocessor reads the stimulated input value from the first memory location in a "Read Stimulated Input Value" step 420.

The microprocessor 110 then compares the stimulated input value with an expected stimulated value for the given stimulation conditions in a "Compare Stimulated Input Value With Expected Input Value" step 430. If the comparison reveals that the stimulated input value and the expected input value are within tolerance of each other, the microprocessor determines that the conditioning circuitry, analog to digital converter, and the multiplexor 140 (if present) are healthy. Otherwise, the microprocessor 110 determines that at least one of the conditioning circuitry, analog to digital converter, and the multiplexor 140 (if present) is unhealthy, and the microprocessor 110 can move to take any corresponding action.

Figure 5:
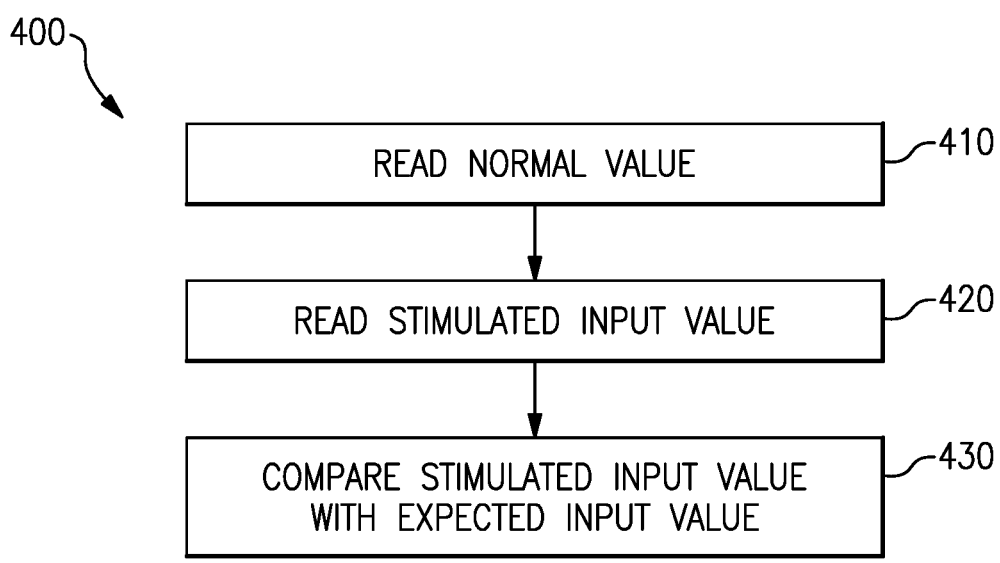
FIG. 5 illustrates a method for verifying the health of each input of the controller configuration of FIG. 2.

While described in FIG. 5 as a process for an individual sensor input, the microprocessor 110 can reiterate the process for any or all sensor inputs which include a stimulated sensor input value, and the health of any corresponding input circuitry can be determined. In this way, the health of each individual sensor input can be determined.

While described above with regards to a microprocessor controller within a control system 20 of an aircraft, it is understood that the system and method can be applied to any digital controller including a microprocessor and receiving analog inputs and is not limited to aircraft applications.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A controller system comprising:
a microprocessor including a multiplexer sequencer configured to output at least one spare multiplexor control signal, a memory, and plurality of sensor inputs;
at least one stimulation circuit connected to a sensor signal line, the at least one stimulation circuit being connected to the at least one spare multiplexor control signal;
wherein the stimulation circuit is configured such that a state of the at least one spare multiplexor control signal controls a state of the stimulation circuit; and
a multiplexor having a plurality of multiplexor sensor inputs and a multiplexed output, wherein the multiplexed output is received at one of the plurality of sensor inputs, and the multiplexer sequencer is further configured to output at least one multiplexor control signal to the multiplexor.

2. The controller system of claim 1, wherein the microprocessor further includes at least one analog to digital converter, and each of the sensor inputs in the plurality of sensor inputs is received at the analog to digital converter.

3. The controller system of claim 1, wherein the at least one stimulation circuit includes a first stimulation circuit connected to a sensor line connected to one of the multiplexor sensor inputs in the plurality of multiplexor sensor inputs.

4. The controller system of claim 1, wherein the at least one stimulation circuit further includes a second stimulation circuit connected to a second sensor line, and the second sensor line is connected to one of the sensor inputs in the plurality of sensor inputs.

5. The controller system of claim 1, wherein the at least one stimulation circuit is configured to operate as a passthrough circuit when the at least one spare multiplexor control signal is in a first state.

6. The controller system of claim 5, wherein the at least one stimulation circuit is configured to drive the sensor signal to a first value when the at least one spare multiplexor control signal is in a second state, the second state being distinct from the first state.

7. The controller system of claim 5, wherein the at least one spare multiplexor control signal includes a plurality of spare multiplexor control signals and the number of states in which the stimulation circuit is dependent on a quantity of spare multiplexor signals in the at least one spare multiplexor signal.

8. The controller system of claim 1, wherein the at least one stimulation circuit comprises a plurality of stimulation circuits, each of the stimulation circuits being connected to a corresponding sensor signal line.

9. The controller system of claim 8, wherein each of the stimulation circuits in the plurality of stimulation circuits is controlled via a first spare multiplexor signal in the at least one spare multiplexor control signal.

10. The controller system of claim 8, wherein each of the stimulation circuits in the plurality of stimulation circuits is controlled via a distinct spare multiplexor signal in the at least one spare multiplexor control signal.

11. The controller system of claim 1, wherein each sensor signal line is connected to an aircraft sensor.

12. A method for testing a microprocessor comprising:
stimulating at least one sensor input via a stimulation circuit, wherein the stimulation circuit is controlled by at least one spare multiplexor signal output from a microprocessor multiplexer sequencer, wherein the spare multiplexor signal output is a multiplexor control signal that is not required to control a multiplexor;
analyzing a response of the at least one sensor input; and
determining that at least one of a multiplexor and a conditioning circuit are healthy in response to the stimulated sensor input matching an expected stimulated sensor input.

13. The method of claim 12, wherein stimulating at least one sensor input comprises stimulating the sensor input for a duration of time at least as long as a circuit settling time.

14. The method of claim 12, wherein stimulating the at least one sensor input comprises providing a plurality of spare multiplexor signal outputs from the microprocessor multiplexer sequencer to the stimulation circuit.

15. The method of claim 14, wherein stimulating the at least one sensor input comprises driving the at least one sensor input to one of a plurality of predefined values, wherein the value is determined based on a high and low state of each of the spare multiplexor signal outputs in the plurality of multiplexor signals.

16. The method of claim 12, wherein stimulating at least one sensor input via a stimulation circuit comprises engaging a first stimulation circuit via a first spare multiplexor signal output, and engaging a second stimulation circuit via a second spare multiplexor output signal.

17. The method of claim 12, further comprising operating the stimulation circuit as a pass through circuit when no control signal is output by the multiplexer sequencer on the at least one spare multiplexor signal output.

18. An aircraft control system comprising:
a general aircraft controller;
a plurality of dedicated systems controllers, each of said dedicated systems controllers including a microprocessor connected to a sensor network;
each of the microprocessors in the plurality of dedicated systems controllers includes a multiplexer sequencer configured to output a plurality of multiplexor control signals to a multiplexor and at least one spare multiplexor control signal, wherein the at least one spare multiplexor control signal is a multiplexor control signal that is not required to control the multiplexor, a memory, and plurality of sensor inputs, at least one stimulation circuit connected to a sensor signal line, the at least one stimulation circuit being connected to the at least one spare multiplexor control signal, and wherein the stimulation circuit is configured such that a state of the at least one spare multiplexor control signal controls a state of the stimulation circuit.

* * * * *